(12) United States Patent
Paliwal et al.

(10) Patent No.: US 7,078,903 B2
(45) Date of Patent: Jul. 18, 2006

(54) STEADY STATE FREE PRECESSION BASED MAGNETIC RESONANCE THERMOMETRY

(75) Inventors: Vaishali Paliwal, Baltimore, MD (US); Abdel-Monem El-Sharkawy, Baltimore, MD (US); Ergin Atalar, Columbia, MD (US)

(73) Assignee: Johns Hopkins University, Baltimore, MD (US)

( * ) Notice: Subject to any disclaimer, the term of this patent is extended or adjusted under 35 U.S.C. 154(b) by 0 days.

(21) Appl. No.: 10/850,450

(22) Filed: May 21, 2004

(65) Prior Publication Data

US 2005/0052183 A1    Mar. 10, 2005

Related U.S. Application Data

(60) Provisional application No. 60/473,296, filed on May 23, 2003.

(51) Int. Cl.
*G01V 3/00*    (2006.01)

(52) U.S. Cl. ...................... 324/319; 324/307
(58) Field of Classification Search ............. 324/307, 324/309, 318, 319, 322, 300; 600/410, 407, 600/612
See application file for complete search history.

(56) References Cited

U.S. PATENT DOCUMENTS

| | | | |
|---|---|---|---|
| 4,558,279 A | 12/1985 | Ackerman et al. | |
| 6,194,899 B1 | 2/2001 | Ishihara et al. | |
| 6,377,834 B1 | 4/2002 | Zhou et al. | |
| 6,542,767 B1 * | 4/2003 | McNichols et al. | 600/407 |
| 2004/0041563 A1 * | 3/2004 | Lewin et al. | 324/307 |

OTHER PUBLICATIONS

Kettenbach, J., et al., *Monitoring and visualization techniques for MR-guided laser ablations in an open MR system.* J Magn Reson Imaging, 1998. 8(4): p. 933-43.

Chen, J.C., et al., Prostate cancer.: *MR imaging and thermometry during microwave thermal ablation-initial experience.* Radiology, 2000. 214(1): p. 290-7.

Matsumoto, R., et al., *Tissue temperature monitoring for thermal interventional therapy: comparison of TI-weighted MR sequences.* J Magn Reson Imaging. 1994. 4(1): p. 65-70.

(Continued)

*Primary Examiner*—Brij B. Shrivastav
(74) *Attorney, Agent, or Firm*—McKenna Long & Aldridge LLP

(57) ABSTRACT

Disclosed is a method and system for steady state free precession based magnetic resonance thermometry that measures changes in temperature on a pixel by pixel basis. The method comprises generating an RF pulse sequence used to find the proton resonance frequency shift, which is proportional to temperature change, processing the resultant MRI data to measure the proton frequency shift, and converting the measured proton frequency shift into change in temperature data. Further disclosed is a method for identifying and compensating for temperature drifts due to core heating of the gradient magnet.

31 Claims, 7 Drawing Sheets

OTHER PUBLICATIONS

Le Bihan, D., J. Delannoy, and R.L. Levin, *Temperature mapping with MR imaging of molecular diffusion: application to hyperthermia*. Radiology, 1989. 171(3): p. 853-7.

Kuroda, K., et al., *Temperature mapping using the water proton chemical shift: a chemical shift selective phase mapping method*. Magn Reson Med, 1997. 38(5): p. 845-51.

Peters, R.D., R.S. Hinks, and R.M. Henkelman, *Heat-source orientation and geometry dependence in proton-resonance frequency shift magnetic resonance thermometry*. Magn Reson Med, 1999. 41(5): p. 909-18.

Bottomley, P.A., et al., *A review of normal tissue hydrogen NMR relaxation times and relaxation mechanisms from 1-100 MHz: dependence on tissue type, NAM frequency, temperature, species, excision, and age*. Med Phys, 1984. 11(4): p. 425-48.

Lewa, C.J. and Z. Majewska, *Temperature relationships of proton spin-lattice relaxation time Tl in biological tissues*. Bull Cancer, 1980. 67(5): p. 525-30.

Graham, S.J., M.J. Bronskill, and R.M. Henkelman, *Time and temperature dependence of MR parameters during thermal coagulation of ex vivo rabbit muscle*. Magn Reson Med, 1998. 39(2): p. 198-203.

Hindman, J.C., *Proton resonance shift of water in the gas and liquid states*. Journal of chemical physics, 1966(44): p. 4582-4592.

Chen, L., et al., *Study of laser ablation in the in vivo rabbit brain with MR thermometry*. J Magn Reson Imaging, 2002. 16(2): p. 147-52.

Zur, Y., M.L. Wood, and L.J. Neuringer, *Motion-insensitive, steady-state free precession imaging*. Magn Reson Med, 1990. 16(3): p. 444-59.

* cited by examiner

STEADY STATE FREE PRECESSION BASED MAGNETIC RESONANCE THERMOMETRY

This application claims the benefit of U.S. Provisional Patent Application No. 60/473,296, filed on May 23, 2003, which is hereby incorporated by reference for all purposes as if fully set forth herein.

Research and development efforts associated with the subject matter of this patent application was supported by the National Institutes of Health under Grant Nos. ROIRR15369 and ROIHL5748.

BACKGROUND OF THE INVENTION

1. Field of the Invention

The present invention relates to the creation of real-time two or three dimensional Magnetic Resonance (MR) images of temperature changes for use during thermal therapy.

MR thermometry has recently gained attention because of the inportant role it plays during thermal therapy. In thermal therapy it is important to ensure that the required thermal dose is delivered to the entire target tissue, while at the same time the surrounding tissues are spared of thermal damage. MR thermometry can provide this useful information, as thermal maps can be constructed for the entire region of interest, and temperature variations of each pixel on the image can be monitored. This real time feedback can be used by the physician during the thermal therapy to ensure successful treatment of the target tissue.

2. Discussion of the Related Art

Many different temperature-monitoring techniques have been used to explore the possibility of using thermal mapping under MR guidance. Some of the techniques are based on measuring MR parameters like T1 relaxation time, diffusion coefficient of water and proton resonance frequency shift (PRF) which change with temperature. Different problems are associated with these techniques. Problems include temperature measurement accuracy, repeatability, calibration, and dependence on geometry and orientation.

These unsolved problems point to a need for better and more stable MR based thermometry.

SUMMARY OF THE INVENTION

Accordingly, the present invention is directed to Steady State Free Precession (SSFP) based MR thermometry that substantially obviates one or more of the problems due to limitations and disadvantages of the related art.

An advantage of the present invention is to provide a method for MRI based thermometry that substantially enables high resolution real time imagery of temperature changes in a subject.

Another advantage of the present invention is to provide real time high resolution imagery showing temperature changes to enhance the effectiveness of thermal therapy.

Another advantage of the present invention is to provide more precise thermometric imagery by correcting for temperature drift artifacts.

Another advantage of the present invention is to provide T2/T1-weighted images, thereby allowing for good anatomic visualization.

Another advantage of the present invention is to provide thermometric imagery that is inherently rather insensitive to motion and thus suitable for in vivo applications.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and described, a computer readable medium encoded with a program for performing Magnetic Resonance based thermometry, the program comprises the steps of: issuing an instruction to transmit a first RF pulse sequence; receiving a first set of MR signal data, the first set of MR signal data corresponding to the first RF pulse sequence; interpolating the first set of MR signal data, the interpolated first set of MR signal data having a plurality of data points; storing the interpolated first set of MR signal data; receiving a second set of MR signal data; interpolating the second set of MR signal data, the interpolated second set of MR signal data having a plurality of data points; determining a phase difference between a peak of the interpolated first set of MR signal data and a peak of the interpolated second set of MR signal data; and converting the phase difference to a change in temperature.

In another aspect of the present invention, a method for performing Magnetic Resonance based thermometry comprises the steps of: issuing an instruction to transmit a first RF pulse sequence; receiving a first set of MR signal data, the first set of MR signal data corresponding to the first RF pulse sequence; determining a first phase corresponding to a peak within first set of MR signal data; storing the first phase; receiving a second set of MR signal data; determining a second phase corresponding to a peak within the second set of MR data; computing a phase difference between the first phase and the second phase; and converting the phase difference to a change in temperature data.

In another aspect of the present invention, a system for performing MRI-based thermometry, comprises: a gradient magnet; an RF coil; an RF amplifier connected to the RF coil; a spectrometer; and a computer, the computer having a computer readable medium encoded with a program for performing steady state free precession based thermometry, wherein the program is for generating an RF pulse sequence used to find the proton frequency shift, processing the resultant MRI data to measure the proton frequency shift, and converting the measured proton frequency shift into change in temperature data.

In another aspect of the present invention, a method for measuring noise in magnetic resonance thermometry using an MRI system, the MRI system having a gradient magnet, an RF coil, and a phantom, the method comprises the steps of: allowing the gradient and the phantom to cool; acquiring a first MRI data of the phantom, with the gradient magnet turned off; acquiring a first temperature measurement of the phantom; heating the phantom; acquiring a second temperature measurement of the phantom; acquiring a second MRI data of the phantom, with the gradient magnet turned off; calculating a temperature coefficient of the phantom using the first and second MRI data and the first and second temperature measurements; transmitting a gradient demanding pulse sequence to the gradient magnet; acquiring a first temperature measurement of the gradient magnet; acquiring a third MRI data of the phantom; allowing the gradient magnet to cool; acquiring a second temperature measurement of the gradient magnet; acquiring a fourth MRI data of the phantom, with the gradient magnet turned off; and calculating a temperature drift in the phantom corresponding to a heating of the gradient magnet, using the third and fourth MRI data, the first and second temperature measurements of the gradient magnet, and the temperature coefficient of the phantom.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
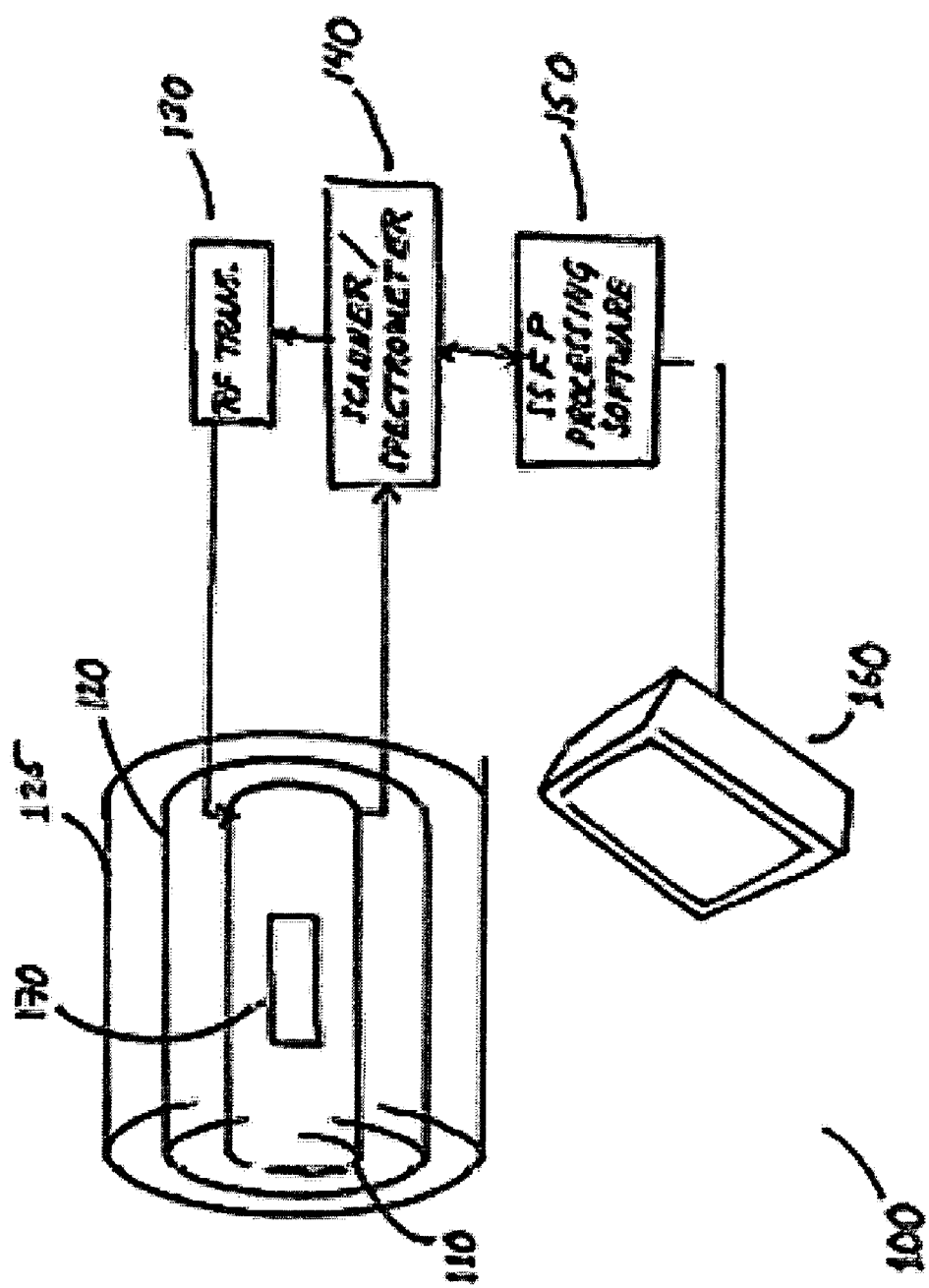
FIG. 1 shows an exemplary MRI system of the present invention.

FIG. 1 shows an exemplary MRI system according to the present invention. The system 100 comprises an RF coil 110; a gradient magnet 120; a main magnet 125; an RF transmitter 130; a scanner/spectrometer 140; a computer having a computer readable medium encoded with SSFP processing software 150; and a display 160.

In this exemplary embodiment, the main magnet 125 provides a uniform primary magnetic field, while the gradient magnet 120 provides known inhomogeneities that may be exploited for spatially encoded information. The SSFP processing software 150 generates and issues commands for the RF transmitter 130 to transmit a specific RF pulse sequence to the RF coil 110. The RF energy from the RF coil passes through the target tissue 170. The RF coil 110 subsequently serves as an RF antenna, sensing the MR response of the target tissue 170 to the transmitted RF pulses. The scanner/spectrometer detects the RF energy returned from the target tissue 170 though the RF coil 110, and converts the RF resulting RF signals into formatted digital data that may represent images of the target tissue 170. The SSFP processing software 150 receives and processes the formatted digital data, and in doing so, generates an image showing a pixel-by-pixel measurement of the change in temperature relative to a baseline measurement. The image is then sent to the display 160.

The SSFP processing software 150 may reside on a host computer integral to the MRI system, it may reside on a separate computer than communicates with the MRI system via a network connection, or it may reside in an embedded processor within the scanner/spectrometer 140. Further, it may be located in a remote location, communicating with the rest of the system 100 over the internet. The computer hosting the SSFP processing software 150 may communicate directly with the RF transmitter 130, or may communicate exclusively with the scanner spectrometer 140, which then may relay the relevant commands to the RF transmitter 130. Finally, the SSFP processing software 150 may reside on multiple computers, whereby different software functionality may be stored and execute on any or all of the platforms like those listed above.

The present invention is directed to exploiting the principle that if two frequency-offset curves obtained at different temperatures are correlated, there will be a phase shift between them due to the proton resonant frequency shift in water proportional to the change in temperature.

Figure 2:
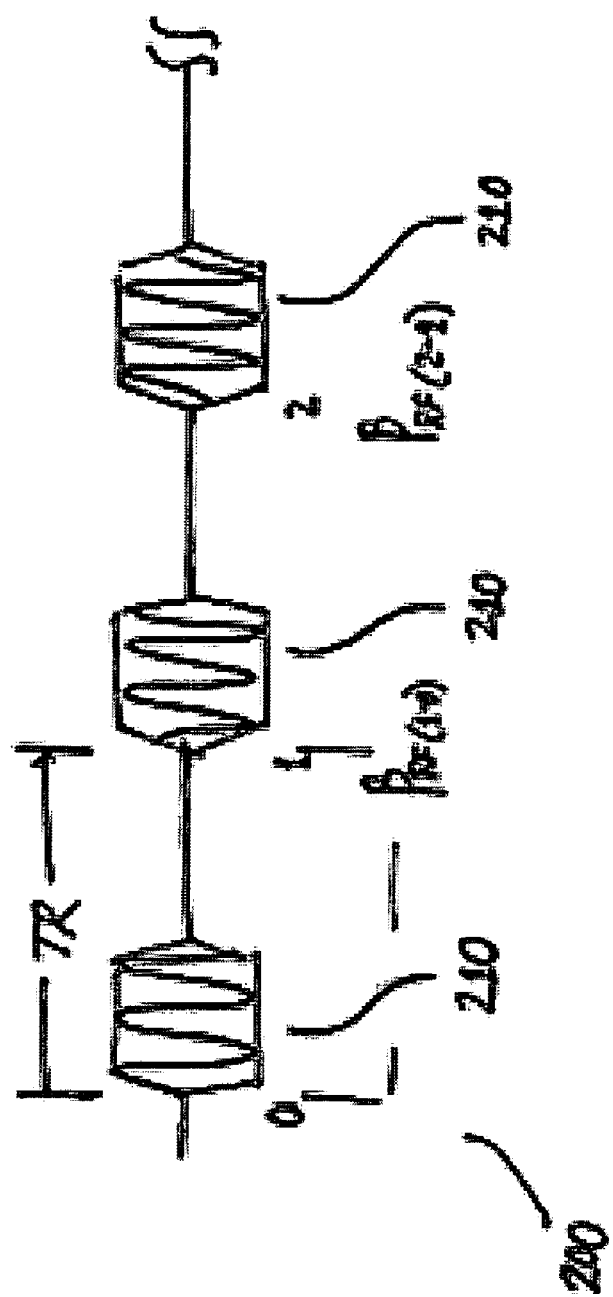
FIG. 2 shows an exemplary SSFP RF pulse sequence according to the present invention.

FIG. 2 depicts an exemplary SSFP RF pulse sequence 200 according to the present invention. The pulse sequence 200 comprises a plurality of RF pulses 210, each issued with a period substantially equal to a user-configurable repetition time (TR). The phase difference between pulses, $\beta_{RF}$ can be controlled by, for example, the SSFP processing software 150. The pulse sequence may be controlled such that $\beta_{RF}$ may successively changed between pulses, enabling the phase difference $\beta_{RF}$ to cycle from substantially 0 to $2\pi$, or some other range, during a pulse sequence.

Figure 3:
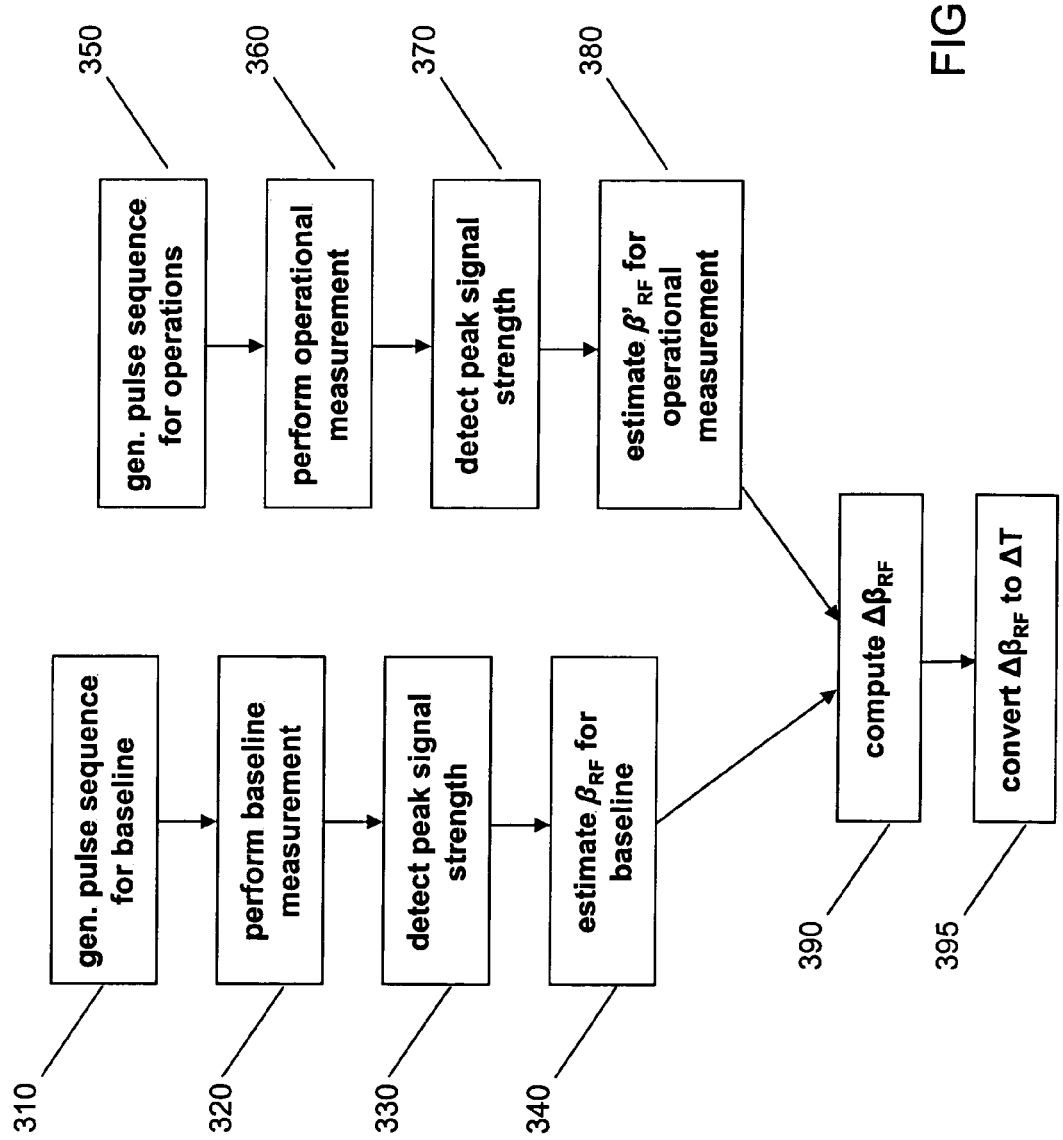
FIG. 3 is an exemplary process for performing SSFP based MR thermometry according to the present invention.

FIG. 3 shows an exemplary process for creating SSFP based MR thermometric imagery according to the present invention. Steps 310–340 pertain to the collection and processing of a set of baseline data to be used as the reference to which subsequent measurements will be compared to determine change in temperature. In step 310, the SSFP processing software 150 generates a command to the RF transmitter 130 with the appropriate instructions to construct and transmit an RF pulse sequence, designed for taking a baseline measurement, to the RF coil 110.

In step 320, the SSFP processing software 150 receives the formatted digital data, from the scanner/spectrometer 140, that corresponds to the detected RF energy emitted by the target tissue 170 in response to the RF pulse sequence from the RF coil 110. This baseline data may comprise a set of signal strengths, each of which corresponds to a different $\beta_{RF}$ in the pulse sequence, with one set for each pixel.

Figure 4:
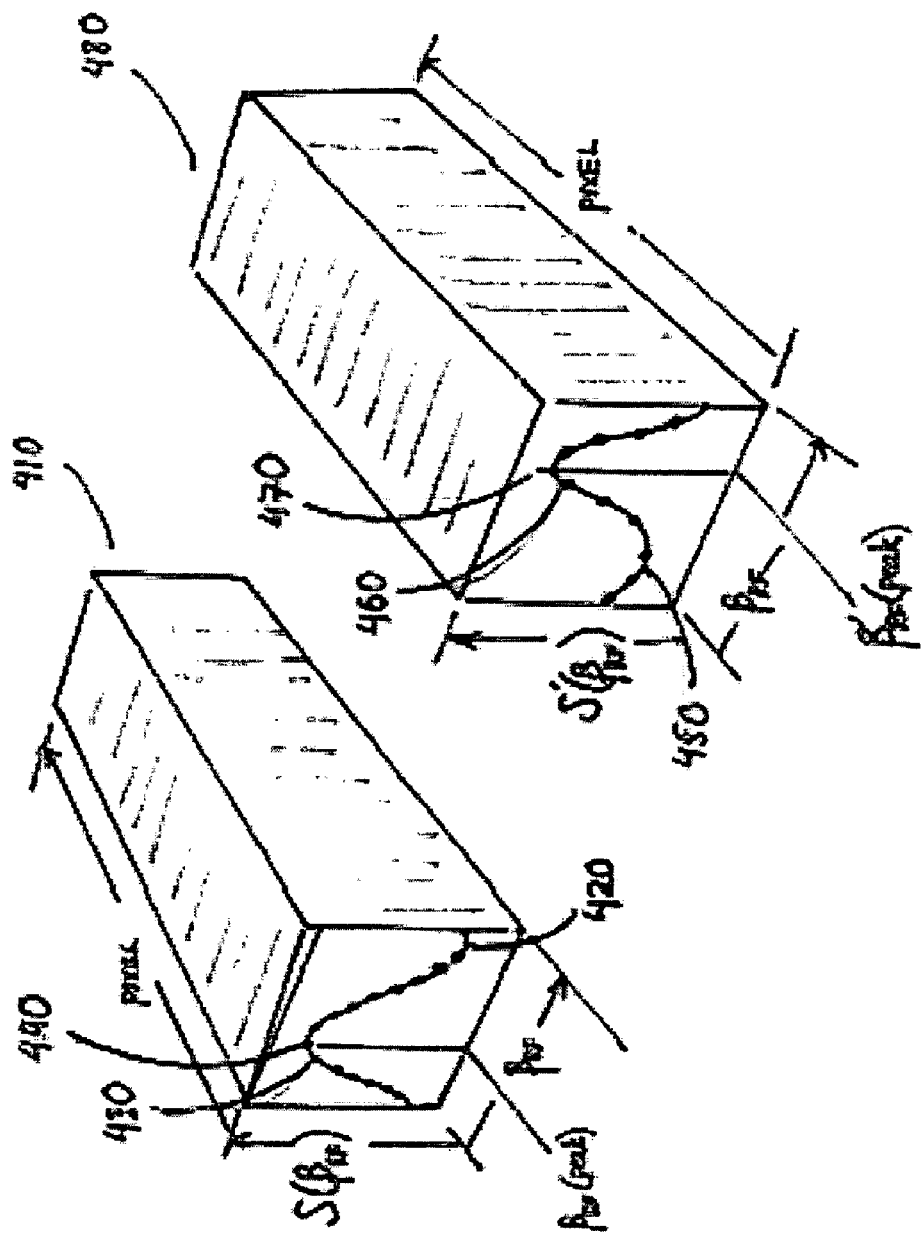
FIG. 4 shows an example baseline data set and an example operational data set.

FIG. 4 shows a representation of an exemplary baseline data set 410. As shown in this representation, for each pixel, there is a set of data points 430, wherein each data point represents a received signal strength for that particular pixel, for each $\beta_{RF}$. The data points define a curve 420. The shape of the curve is substantially a function of T1, T2, and flip angle (the angle to which the net magnetization vector is tilted relative to the magnetic field generated by the main magnet 125). The peak of the curve 420 substantially corresponds to the point where the total offset resonance angle $\beta_{total}$ is equal to 0 or $\pi$, and is a function of $\beta_{RF}$. At the peak, the signal strength $S(\beta_{RF})$ is a function of temperature, and not a function of T1 or T2. In other words, at the peak of $S(\beta_{RF})$, the temperature effects of T1 and T2 fall away.

The peak signal strength 440 is detected for each pixel in the baseline data 410 in step 330. It will be appreciated that this may be accomplished by any of a number of processing algorithms. The peak detection need not be constrained to the baseline data acquired, and may interpolate or implement some form of localized curve fitting to estimate the peak, while balancing the requirements for accuracy with the constraints of computing power. Having identified the peaks, the value of $\beta_{RF}$ corresponding to each of the peaks are estimated and stored. This baseline phase data may comprise a single baseline $\beta_{RF}$ value for each pixel. The precision of the baseline $\beta_{RF}$ data may depend on the fidelity of the algorithm employed in step 330, and the number of data points taken, which corresponds to the number of pulses in the baseline RF pulse sequence.

Having acquired and stored a baseline set of $\beta_{RF}$, operational measurements are acquired in steps 350–380. This data will be compared to the baseline to determine the change in temperature on a pixel-by-pixel basis.

In step 350 the SSFP processing software 150 generates a command to the RF transmitter 130 with the appropriate instructions to construct and transmit an RF pulse sequence, designed for taking an operational measurement, to the RF coil 110. This operational RF pulse sequence may be distinct from the baseline RF pulse sequence, since it's design may be driven by different requirements. For example, it may be more important for the baseline to be precise, than it is for it to be generated quickly. On the other hand, for example, the operational RF pulse sequence may be tailored to substantially optimize the speed of processing, balancing the need for real-time imagery over precision.

The operational data is collected in step 360, in which the SSP processing software 150 receives operational formatted digital data from the scanner/spectrometer 140. This data is processed from the RF energy emitted by the target tissue 170, which is sensed by the RF coil 110, and subsequently detected by the scanner/spectrometer 140. The sensed RF energy is generally in response to the operational RF pulse sequence generated in step 350.

The operational data may be assembled into a data structure similar to data structure 480 that is represented in FIG. 4. The operational data set 480 comprises a set of signal strengths per $\beta_{RF}$ for each pixel. As with the baseline data set 410, the operational data set 480 has a distinct peak 470 per pixel that corresponds to the phase $\beta_{RF}$ at which point the temperature dependent effects of T1 and T2 drop out.

The peak signal strength for each pixel of operational data is detected in step 370. As with the baseline counterpart, any of a number of signal processing algorithms may be employed to identify the peak 470 of the $S'(\beta_{RF})$ data. However, given that the requirements for operational data may differ for that of baseline data, an algorithm may be selected that emphasizes speed over precision. This would be a factor in a design tradeoff between precision and the need for real-time imagery.

Having identified the peaks 470 in step 370, the corresponding phases $\beta_{RF}$ may be derived in step 380. The result of step 380 is a set of $\beta_{RF}$ data, one per pixel. This resulting data may be buffered for subsequent processing.

Having generated a baseline and an operational set of $\beta_{RF}$ values, one pair per pixel, their difference is computed in step 390, resulting in one set of $\Delta\beta_{RF}$ values per pixel.

The change in temperature may be calculated from the $\Delta\beta_{RF}$ data set derived in step 390. $\Delta\beta_{RF}$, the shift in the signal strength peak, is a function of the change in temperature for a given pixel, keeping other parameters constant, and is given by the equation:

$$\Delta\beta_{RF} = -\alpha TR \Delta T \omega_0$$

In this equation, $\alpha$ is the proton resonance shift coefficient expressed in ppm/° C.; $\Delta T$ is the temperature change; and $\omega_0 = \gamma B_0$, where $B_0$ is the main magnetic field strength, and $\gamma$ is the gyromagnetic ratio. The parameters $\alpha$, and $\gamma$ are known constants, while the remaining parameters, $B_0$ and TR, are both known and controllable by the system operator. For example, TR is one of the parameters used to generate the RF pulse sequences, as shown in FIG. 2. Thus an SSFP RF pulse sequence, as generated by the SSFP processing software 150, can be used to calculate the proton resonance frequency shift of water proportional to the temperature change.

The resulting set of image data, representing the change in temperature relative to the baseline, may be subsequently sent to a display device, such as a TV or monitor. The data may alternatively, or additionally, be stored on a recording device for later playback. The data may further be transmitted over a network connection to be viewed and/or stored in a remote location.

Figure 5:
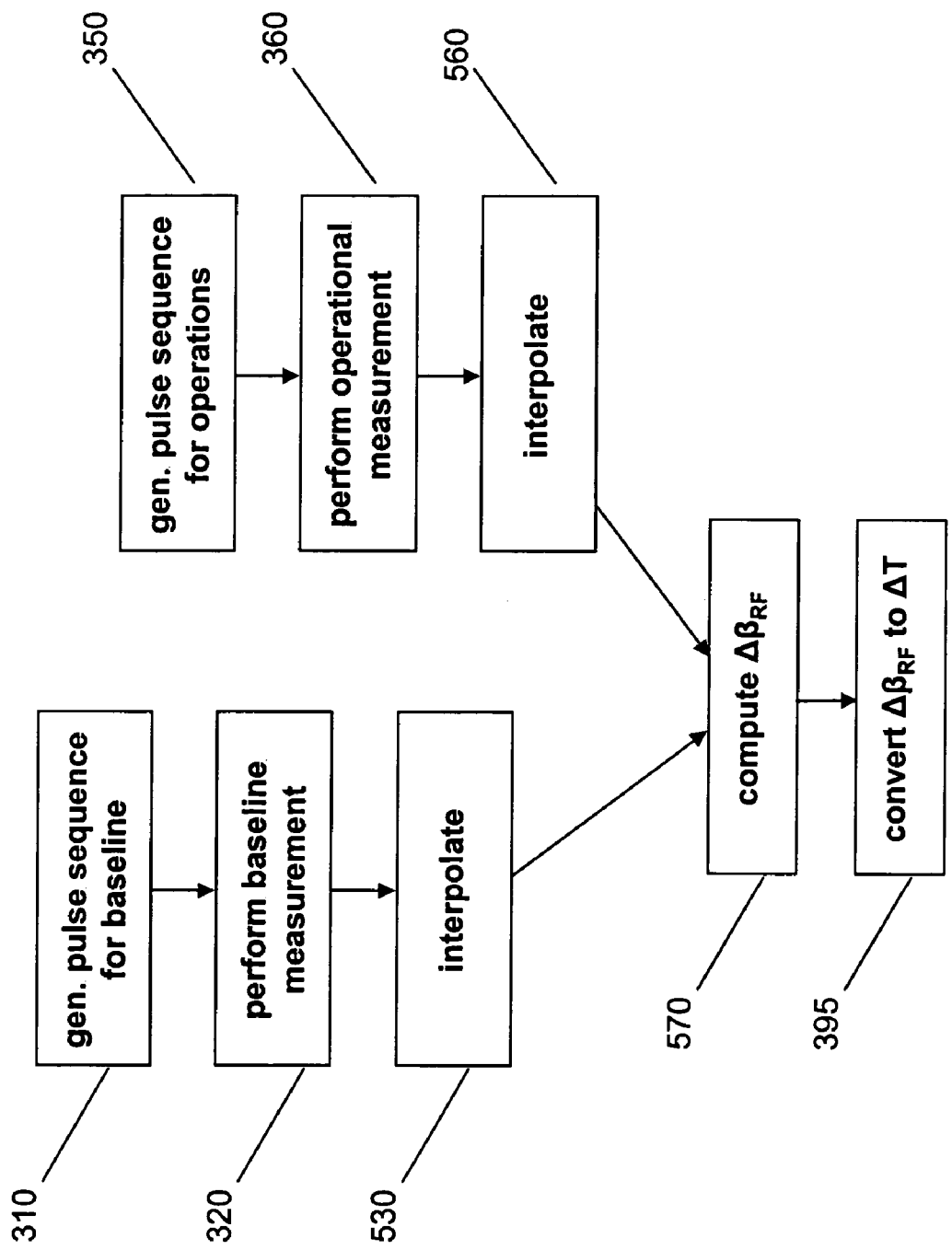
FIG. 5 is an alternative exemplary process for performing SSFP based MR thermometry according to the present invention.

FIG. 5 shows an alternate exemplary process for determining the proton resonant frequency shift in water in a target tissue, and thereby measuring the change in temperature for the target tissue on a pixel-by-pixel basis. In this alternate exemplary process, a baseline RF pulse sequence is generated, and corresponding measurements taken, as shown in steps 310 and 320 in FIG. 5, respectively. Also, the operational RF pulse sequence is generated, and corresponding measurements taken, in respective steps 350 and 360 in FIG. 5. However, the resulting $\Delta\beta_{RF}$ term may be calculated by different means than done in FIG. 3. In the process in FIG. 5, the collected baseline data 410 may be interpolated in step 530. The interpolation step substantially changes the resolution of the $S(\beta_{RF})$ from that of the acquired data points 410, to a different resolution of $\beta_{RF}$, an example of which is shown in the interpolated curve 420 in baseline data 410. Similarly, the operational data set 480 may be interpolated in step 360 to increase the resolution of $\beta_{RF}$, as shown in curve 450.

The interpolation may be implemented differently for the baseline and the operational data sets, since the baseline and operational data assembled in respective steps 320 and 360 may have different resolutions. Either or both interpolation steps 530 and 560 may employ a spline function, although many other interpolation techniques may be used.

Figure 6:
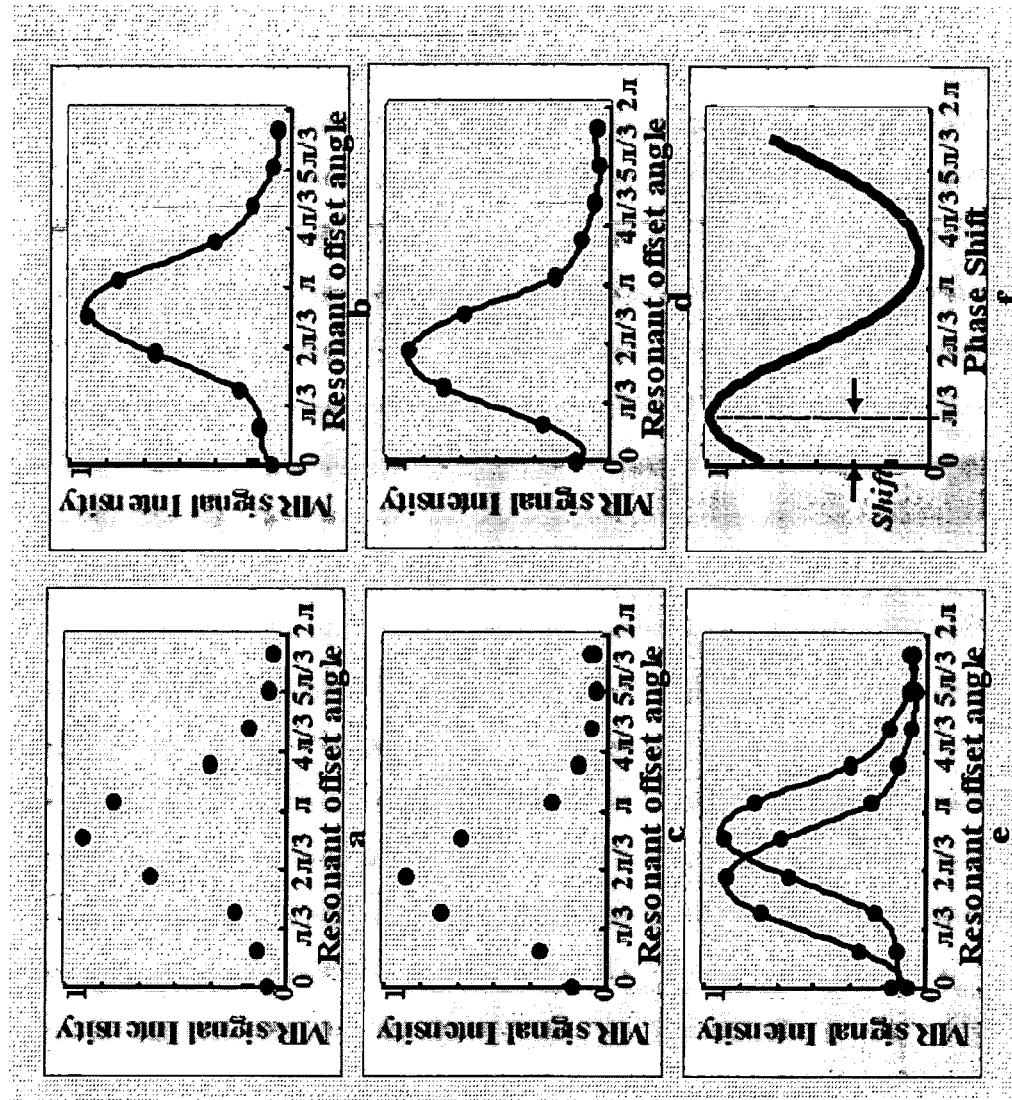
FIG. 6 shows an example of intermediate steps of interpolation and correlation as done in a process of the present invention.

In this exemplary process, the compute $\Delta\beta_{RF}$ step 570 may implement a correlation algorithm on the two interpolated data sets, yielding a single $\Delta\beta_{RF}$ value for each pixel. Any of a multitude of correlation algorithms may be used. A circular cross-correlation algorithm is one example of such an algorithm. See FIG. 6 for an exemplary depiction of the process of FIG. 5, as implemented on one pixel of data. The baseline data assembled in step 320 may be represented as shown in FIG. 6(*a*); whereas the operational assembled in step 360 data may be exemplified in FIG. 6(*c*). The results of their respective interpolations, done in steps 530 and 560, may be approximated in FIG. 6(*b*) and FIG. 6(*d*), respectively. An example of both of these interpolated data sets are depicted in FIG. 6(*e*). Finally, the result of the correlation may be represented in FIG. 6(*f*). As shown in FIG. 6(*f*), the peak of the resulting correlation corresponds to the $\Delta\beta_{RF}$ for that given pixel. Having computed a value for $\Delta\beta_{RF}$ per pixel, the resulting change in temperature may be computed in step 395 of FIG. 5, which is substantially the same as the same-numbered step in FIG. 3. As with the process in FIG. 3, the resulting data may be sent to a display, a computer, or a memory storage device.

The baseline and operational measurement sub-processes in FIG. 3 and FIG. 5 preferably include a fat suppression or fat/water separation method.

The exemplary processes of FIG. 3 and FIG. 5 may be iterated, producing a sequence of thermometric images. Either process may iterate whereby once the $\Delta T$ data is generated, the process returns to step 350, and repeats the collection and processing of operational data. The new operational data may be processed against the baseline data as done previously. In this manner, each successively computed ΔT is relative to the baseline. It will be apparent that an operator may periodically initiate a new baseline measurement as needed.

Further, it will be apparent that the processes in FIG. 3 and FIG. 5 may be modifiable by an operator whereby the newly computed operational data may be stored in place of the baseline data, becoming the new baseline data set. It is possible to perform measurements such that, instead of being made relative to a single baseline measurement, each operational measurement array 480 may written to the baseline array subsequent to the computation of $\Delta\beta_{RF}$. Under this variation, each measured change in temperature is relative to the previous change in temperature. This variant may prove useful in a situation such as where the temperature of a given region of interest becomes so great that resolution of the surrounding area is lost, and dynamic range is sacrificed. Thus, in order to prevent the loss of dynamic range for the entire image, it may be desired to provide an image that depicts the incremental changes in temperature as well as the total change in temperature relative to the baseline. The option of displaying the thermometric image either as increments, or relative to the baseline, may be switched during operation. Alternatively, both measurements, the incremental temperature changes and the change in temperature relative to the baseline, may be computed in parallel and made simultaneously available to the operator.

In another variation to the preceding exemplary processes, the operational RF sequence may be adjusted with each iteration whereby the previously identified $\beta_{RF}$ corresponding to the peak is buffered for one or more iterations. This way, the stored $\beta_{RF}$ values may be used for focusing, or clustering, subsequent $\beta_{RF}$ values to improve the precision of the operational measurement substantially without sacrificing image processing speed. The buffered $\beta_{RF}$ data may be averaged over successive measurements, creating a windowed average of $\beta_{RF}$ values that may subsequently be used in the computation of $\Delta\beta_{RF}$. The average may be weighted, whereby certain buffered arrays of $\beta_{RF}$ may be given a higher weight than others. Such variations may enable filtering of $\beta_{RF}$ data prior to computation of $\Delta\beta_{RF}$. The creation of the baseline data set 410 may employ such buffering and weighted averaging. All of the buffering and averaging discussed here may be done on a pixel-by-pixel basis.

In a further variation to the preceding exemplary processes, previous ΔT results may be summed, or averaged, over a specified and user-configurable number of iterations, providing a windowed running average that may be sent to a display such as a TV or monitor.

The number of $\beta_{RF}$ data points to be acquired may depend on the temporal resolution required. If the TR is too long, the steady state effect of the sequence is lost and there may be no on/off resonance effects visible on the image. An increase in TR also reduces the temporal resolution. If the product of TR and the number of samples is small, the sensitivity of the technique to temperature change decreases because there will be less frequency shift per each degree change in temperature. Parameters should be optimized for maximum sensitivity and the temporal resolution, depending on T1 and T2 of the target tissue.

There are some phase drifts associated with this technique that are not related to temperature change. The drifts are substantially spatially invariant. Therefore, any region on the image with a constant temperature may be used to subtract the accumulated drifts. In one such implementation, a region constant in temperature is selected as a reference and the temperature variation due to drift in this region is averaged and then subtracted from the overall temperature measurements, thereby correcting for drifts.

The selection of imaging parameters depends on the procedure and should be optimized. The flip angle, along with T1 and T2 of the target tissue, change the shape of the frequency-offset curves. Lower flip angles, in the range of 3–5°, may be best suited due to shape of frequency offset curves, which makes the method of the present invention more sensitive to temperature. Also, the dependence of the curves on T1/T2 of the target material generally reduces at lower flip angles.

The calculated phase value may drift (change as a function of time). This phase error is partly attributed to the heating of the bore due to use of gradient waveforms. It is possible to characterize the phase stability effects due to anisotropic heating of the gradient magnets during operation, and create an array of calibration coefficients substantially sufficient to back out this effect in the acquired image data Multiple correction algorithms for this phase error can be employed.

Identifying and compensating for gradient magnet heating may require additional components to the system shown in FIG. 1. First, a phantom, or target sample, may be placed in place of, or alongside, the target tissue 170. The phantom preferably comprises a thermally stable material, such as a vegetable oil, which has a resonance frequency independent of temperature. Other materials, such as fats, may be used for the phantom, provided that they have no appreciable frequency/temperature dependence. In an exemplary phantom, a vegetable oil is held in a cylindrical container 6 cm in diameter and 6 cm high. Other dimensions are possible. The container may be made of plastic, but other materials may be used as long as they have substantially no MR signal and they are MR compatible.

Second, two temperature sensors may be added: a first temperature sensor, which may be installed at a fixed point substantially in the center of the inner surface of the bore of the gradient magnet 120; and a second temperature sensor, which may be attached to, or installed in, the phantom. The temperature sensors may be a fiberoptic based, although other sensor types, such as thermistors or thermocouples, may be used, provided that they are MR compatible.

Figure 7:
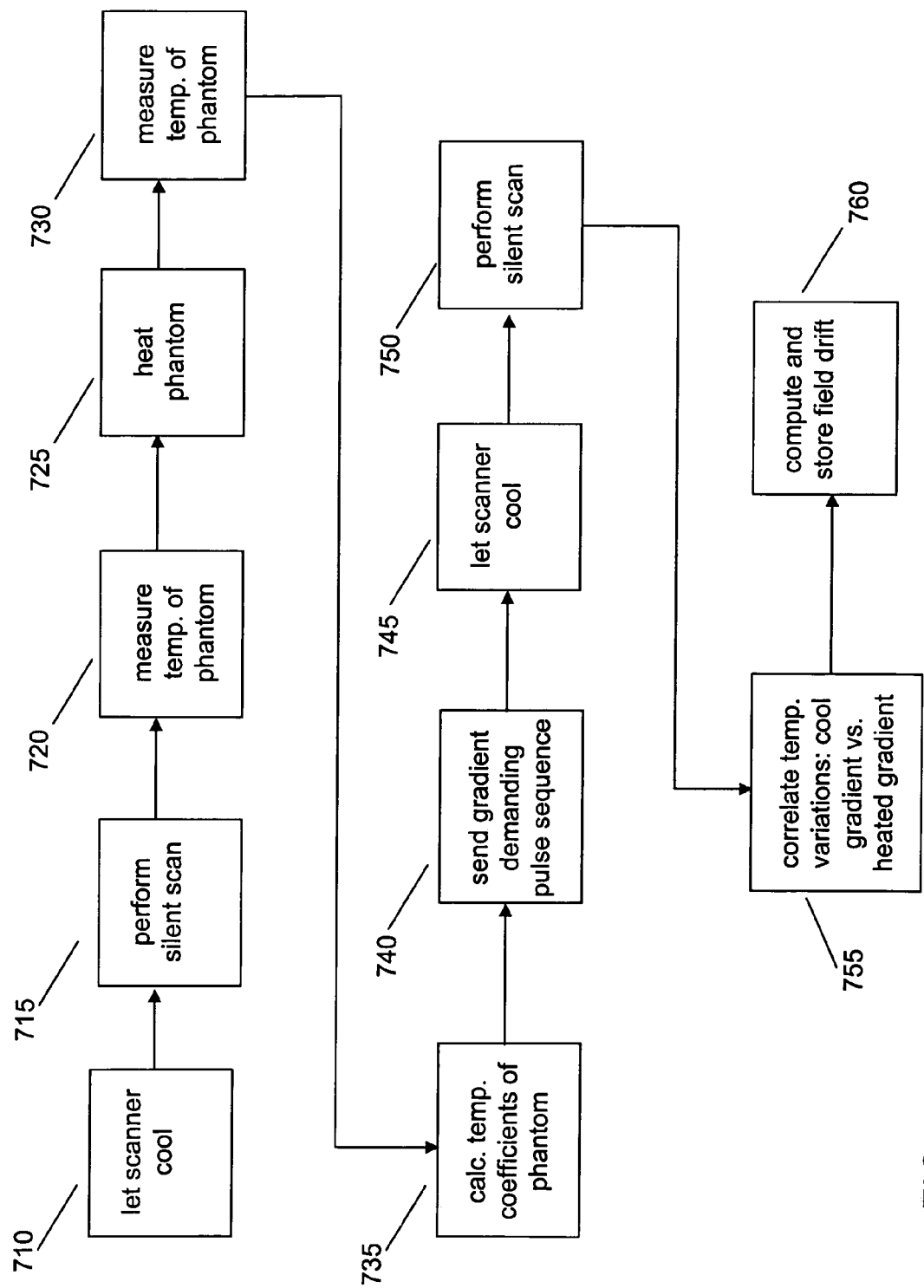
FIG. 7 is an exemplary process for characterizing temperature drifts due to core heating of the gradient magnets.

An exemplary procedure for characterizing phase stability effects due to bore heating is shown in FIG. 7. The exemplary procedure substantially isolates the phase drift due to the bore heating of the gradient magnets 120 by performing repeated temperature measurements on a phantom, at least once with the gradient magnets cooled, and at least once with the gradient magnets heated. In step 710, the gradient magnet 120 and the phantom are allowed to cool to a substantially thermally stable state. With this done, a "silent scan" is performed in step 715, and a set of measurements are taken in step 720. In a silent scan, the gradient magnets are turned off, and the RF pulse sequence for measurements is substantially directed to the RF coils. The system then executes a data processing sequence like that shown in FIG. 3 or FIG. 5, creating a set of ΔT image data. Then, the phantom is heated to a stable temperature, substantially eliminating any thermal gradients, in step 735, and the process is repeated whereby a second set of ΔT image data is generated. With these two ΔT images, and the temperature measurements of the phantom, the SSFP Processing Software 140 calculates the phantom's temperature coefficient. The characterization of the phantom, done in steps 710–735, is done to ensure that thermal variations in the phantom do not contribute to field variations.

Having characterized the phantom in steps 710–735, the SSFP Processing Software 140 generates commands to transmit a gradient demanding pulse sequence to substantially heat the gradient magnet 120 while data is being collected. With this accomplished, the gradient magnet 120 is cooled in step 745, and a silent scan is performed in step 750. Having confirmed the thermal stability of the phantom, and having collected temperature data of the phantom with cooled and heated, the SSFP Processing Software 140 performs a correlation on the silent scan data with the heated gradient magnet data in step 755, and subsequently computes and stores the field drift of the temperature measurements of the phantom as a function of bore heating of the gradient magnets 120.

Depending on the design of the magnet system, the relation between the applied gradient waveform, the status of the gradient cooling mechanism and the applied gradient waveform, can be modeled as a linear or non-linear system in step 755. The predicted drift amount due to bore heating may be modeled from the collected data, and stored in stored in step 760. The modeled and stored bore heating drift affect may be compensated for, by subtracting the field drift data from the acquired temperature data, in step 390 shown in FIG. 3 and FIG. 5. The correction could be done in real time, or in post processing if the image data is to be stored.

Alternatively, a reference phantom may be placed with the target material during scanning during nominal operations, providing a continuous and real time correction for field variations. The predicted drift amount from the phase information can be subtracted from temperature data subsequently taken during nominal operations. In this case, this concurrent characterization process substantially eliminates the need for a separate characterization process like that shown in FIG. 7. The correction could be done in real time, or in post processing if the image data is to be stored. This procedure may comprise identifying a region in the thermometry image data that corresponds to the phantom, sampling one or more change in temperature values from within that region, averaging that sampled data (if necessary), and subtracting the sampled value from all of the data for that image.

Phase error may be corrected by assuming that temperature of the certain parts of the object of interest in not changing during the experiment. The phase of these parts of the body can be used as reference. One or more points on the body may be used as reference, or external materials such as oil samples that generates MRI signal may be used for the same purpose. Some exemplary corrections methods are below.

The zeroth-order reference correction. In this method, the phase error may be assumed to not be a function of position. Therefore the average phase of the reference points can be used as the phase error and can be used to correct for the error in the measurement points. In order for this algorithm to work at least one reference point on the image may be necessary.

The first-order reference correction. In this method, the phase error can be assumed to be a linear function of x, y, and z directions. In this algorithm, the origin for the phase error is assumed to be unknown and may not be the same point as the origin of the gradient waveforms. Therefore, this algorithm requires at least four points on the 3-dimensional temperature measurements, or at least three points on the 2-dimensional temperature measurements are necessary. If the number of reference points is more that these values, parametric fit to the data will generate the phase error function. This function later can be used to correct for the errors in the measurements.

Directional phase error correction. In this method, phase error in one or more predefined direction(s) is/are assumed to be zero. Therefore phase error in the other direction(s) may be estimated using reference points. The minimum number of reference points necessary in order to estimate the phase error can be reduced using this technique. If the number of reference points is more that these values, parametric fit to the data will generate the phase error function. This function later can be used to correct for the errors in the measurements.

Phase-correction for a known origin. When the origin of the phase error is known by an earlier analysis of the scanner phased error characteristics, the number of parameters used in parametric fits can be reduced.

Generally, the SSFP based temperature measurement technique is immune from the phase errors due to temperature dependence of the tissue electromagnetic properties mainly because the measurement is essentially based on the frequency dependent behavior of SSFP. In this method, phase is not directly measured.

Additional temperature dependent measurement can be obtained if the phase of the acquired images is also analyzed using the techniques that are described in the literature. It must be noted that additional information obtained from the phase of the images is immune for the phase errors related with the tissue electromagnetic properties. The deviation of the temperature measurements by using the SSFP-based temperature measurement technique and the image phase based techniques can attributed to the temperature dependence of the electromagnetic properties of the tissue.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A computer readable medium encoded with a program for performing Magnetic Resonance based thermometry, the program comprising the steps of:
   transmitting a first RF pulse sequence;
   receiving a first set of MR signal data, the first set of MR signal data corresponding to the first RF pulse sequence;
   receiving a second set of MR signal data;
   determining a phase difference between a peak of the first set of MR signal data and a peak of the second set of MR signal data; and
   computing a change in temperature based on the phase difference, a magnetic field strength, and a repetition time.

2. The computer readable medium of claim 1, further comprising the step of interpolating the first set of MR signal data, before the step of determining a phase difference, the interpolated first set of MR signal data having a plurality of data points.

3. The computer readable medium of claim 2, wherein the step of interpolating the first set of MR signal data comprises the step of implementing a spline function on the first set of MR signal data.

4. The computer readable medium of claim 1, further comprising the step of interpolating the second set of MR signal data, before the step of determining a phase difference, the interpolated second set of MR signal data having a plurality of data points.

5. The computer readable medium of claim 4, wherein the step of interpolating the second set of MR signal data comprises the step of implementing a spline function on the second set of MR signal data.

6. The computer readable medium of claim 1, further comprising the step of storing the first set of MR signal data, before the step of determining a phase difference.

7. The computer readable medium of claim 1, further comprising the step of transmitting a second RF pulse sequence before receiving the second set of MR signal data, wherein the second set of MR signal data corresponds to the second RF pulse sequence.

8. The computer readable medium of claim 7, wherein the step of transmitting a second RF pulse sequence comprises the steps of:
retrieving from a computer memory location a set of phase differences corresponding to the RF pulses in the second RF pulse sequence;
computing a plurality of parameters for the RF pulses; and
issuing an instruction to transmit the second RF pulse sequence corresponding to the plurality of parameters.

9. The computer readable medium of claim 8, wherein the plurality of parameters comprises a flip angle.

10. The computer readable medium of claim 9, wherein the flip angle is between 3° and 5°.

11. The computer readable medium of claim 1, wherein the step of determining a phase difference comprises the step of performing a circular correlation between the first set of MR signal data and the second set of MR signal data.

12. The computer readable medium of claim 1, wherein the step of transmitting a first RF pulse sequence comprises the steps of:
retrieving from a computer memory location a set of phase differences corresponding to the RF pulses in the first RF pulse sequence;
computing a plurality of parameters for the RF pulses; and
issuing an instruction to transmit the first RF pulse sequence corresponding to the plurality of parameters.

13. The computer readable medium of claim 1, wherein the first set of MR signal data comprises signal strengths as a function of a phase difference between each pulse in the first RF pulse sequence, and a function of pixel.

14. The computer readable medium of claim 1, wherein the second set of MR signal data comprises signal strengths as a function of a phase difference between each pulse in the second RF pulse sequence, and a function of pixel.

15. A method for performing Magnetic Resonance based thermometry comprising the steps of:
generating a first RF pulse sequence;
receiving a first set of MR signal data, the first set of MR signal data corresponding to the first RF pulse sequence;
determining a first phase corresponding to a peak within the first set of MR signal data;
storing the first phase;
receiving a second set of MR signal data;
determining a second phase corresponding to a peak within the second set of MR data;
computing a phase difference between the first phase and the second phase; and
computing a change in temperature based on the phase difference, a magnetic field strength, and a repetition time.

16. The method of claim 15, further comprising the step of generating a second RF pulse sequence, before the step of receiving the second set of MR signal data, wherein the second set of MR signal data corresponds to the second RF pulse sequence.

17. The method of claim 16, wherein the step of generating a second RF pulse sequence comprises the steps of:
retrieving from a computer memory location a set of phase differences corresponding to the RF pulses in the second RF pulse sequence;
computing a plurality of parameters for the RF pulses; and
issuing an instruction to transmit the second RF pulse sequence corresponding to the plurality of parameters.

18. The method according to claim 17, wherein computing the plurality of parameters comprises computing a parameter corresponding to a flip angle between 3° and 5°.

19. The method of claim 16, further comprising the step of averaging the buffered change in temperature data.

20. The method of claim 15, wherein the step of generating a first RF pulse sequence comprises the steps of:
retrieving from a computer memory location a set of phase differences corresponding to the RF pulses in the first RF pulse sequence;
computing a plurality of parameters for the RF pulses; and
issuing an instruction to transmit the first RF pulse sequence corresponding to the plurality of parameters.

21. The method according to claim 20, wherein computing the plurality of parameters comprises computing a parameter corresponding to a flip angle between 3° and 5°.

22. The method of claim 15, further comprising the steps of:
selecting a reference data from the change in temperature data; and
subtracting a value corresponding to the reference data from the change in temperature data.

23. The method of claim 15, further comprising the step of projecting the change of temperature data on a display.

24. The method of claim 15, further comprising the step of buffering the change in temperature data.

25. The method of claim 15, further comprising the step of buffering a the first phase corresponding to the peak within the first set of MR signal data, after the step of determining the first phase.

26. The method of claim 25, further comprising the step of summing the buffered first phase with a previous buffered first phase.

27. The method of claim 15, further comprising the step of setting the first phase equal to the second phase, after the step of computing a phase difference between the first phase and the second phase.

28. A system for performing MRI-based thermometry, comprising:
a gradient magnet;
an RF coil;
an RF amplifier connected to the RF coil;
a spectrometer; and
a computer connected to the RF amplifier, the RF coil, and the gradient magnet, the computer having a computer readable medium encoded with a program for performing steady state free precession based thermometry, wherein the program is for generating an RF pulse sequence used to find the proton frequency shift, processing the resultant MRI data to measure the proton frequency shift, and computing a change in temperature based on a magnetic field strength of the gradient magnet and a repetition time.

29. The system of claim 28, further comprising a phantom, the phantom having a resonance frequency independent of temperature.

30. The system of claim 28, wherein the phantom comprises a vegetable oil.

31. A system for performing MRI-based thermometry, comprising:
   a gradient magnet;
   an RF coil;
   an RF amplifier connected to the RF coil;
   a spectrometer;
   a computer connected to the RF amplifier, the RF coil, and the gradient magnet, the computer having a computer readable medium encoded with a program for performing steady state free precession based thermometry, wherein the program is for generating an RF pulse sequence used to find the proton frequency shift, processing the resultant MRI data to measure the proton frequency shift, and computing a change in temperature based on a magnetic field strength of the gradient magnet and a repetition time; and
   a temperature sensor disposed on the gradient magnet, the temperature sensor having a signal connection to the computer.

* * * * *